US012593466B2

(12) United States Patent
Wirths et al.

(10) Patent No.: US 12,593,466 B2
(45) Date of Patent: Mar. 31, 2026

(54) POWER FIELD-EFFECT TRANSISTOR AND MANUFACTURING METHOD

(71) Applicant: HITACHI ENERGY LTD, Zürich (CH)

(72) Inventors: Stephan Wirths, Thalwil (CH); Lars Knoll, Hägglingen (CH); Lukas Kranz, Zürich (CH)

(73) Assignee: HITACHI ENERGY LTD, Zürich (CH)

( * ) Notice: Subject to any disclaimer, the term of this patent is extended or adjusted under 35 U.S.C. 154(b) by 435 days.

(21) Appl. No.: 18/035,086

(22) PCT Filed: Nov. 4, 2020

(86) PCT No.: PCT/EP2020/080983
§ 371 (c)(1),
(2) Date: May 2, 2023

(87) PCT Pub. No.: WO2022/096088
PCT Pub. Date: May 12, 2022

(65) Prior Publication Data
US 2023/0411510 A1     Dec. 21, 2023

(51) Int. Cl.
*H10D 30/66*     (2025.01)
*H10D 30/01*     (2025.01)
(Continued)

(52) U.S. Cl.
CPC ....... *H10D 30/668* (2025.01); *H10D 30/0297* (2025.01); *H10D 62/154* (2025.01);
(Continued)

(58) Field of Classification Search
CPC ....... H10D 62/149–161; H10D 62/021; H10D 30/0277; H10D 84/013–0133;
(Continued)

(56) References Cited

U.S. PATENT DOCUMENTS

| | | | | |
|---|---|---|---|---|
| 6,429,481 B1 * | 8/2002 | Mo | ...................... | H10D 30/668 |
| | | | | 257/E29.066 |
| 6,710,403 B2 * | 3/2004 | Sapp | ................... | H02M 3/1588 |
| | | | | 257/341 |

(Continued)

FOREIGN PATENT DOCUMENTS

| | | |
|---|---|---|
| EP | 0923137 A2 | 6/1999 |
| GB | 2572442 A | 10/2019 |
| WO | 2019/186126 A1 | 10/2019 |

OTHER PUBLICATIONS

Peters et al., The new CoolSiC™ Trench MOSFET Technology for Low Gate Oxide Stress and High Performance, Published in: PCIM Europe 2017; International Exhibition and Conference for Power Electronics, Intelligent Motion, Renewable Energy and Energy Management, 2017, ISBN:978-3-8007-4424-4, Germany, 7 pages.

*Primary Examiner* — Maliheh Malek
(74) *Attorney, Agent, or Firm* — PROCOPIO, CORY, HARGREAVES & SAVITCH LLP

(57) ABSTRACT

In one embodiment, the power field-effect transistor (1) comprises:
- at least two source regions (21) at a top side (20) of a semiconductor body (2),
- a drain region (22) at a back side (23) of the semiconductor body (2),
- at least two charge barrier regions (24) in the semiconductor body (2) so that electrically between each one of the source regions (21) and the drain region (22) there is one of the charge barrier regions (24), and
- a gate electrode (3) located in a trench (4) in the semiconductor body (2), and the charge barrier regions (24) are located adjacent to the trench (4), wherein, next to the trench (4) and seen in a first plane (A) perpendicular with the top side (21) and a main elongation direction (Continued)

Figure 1:
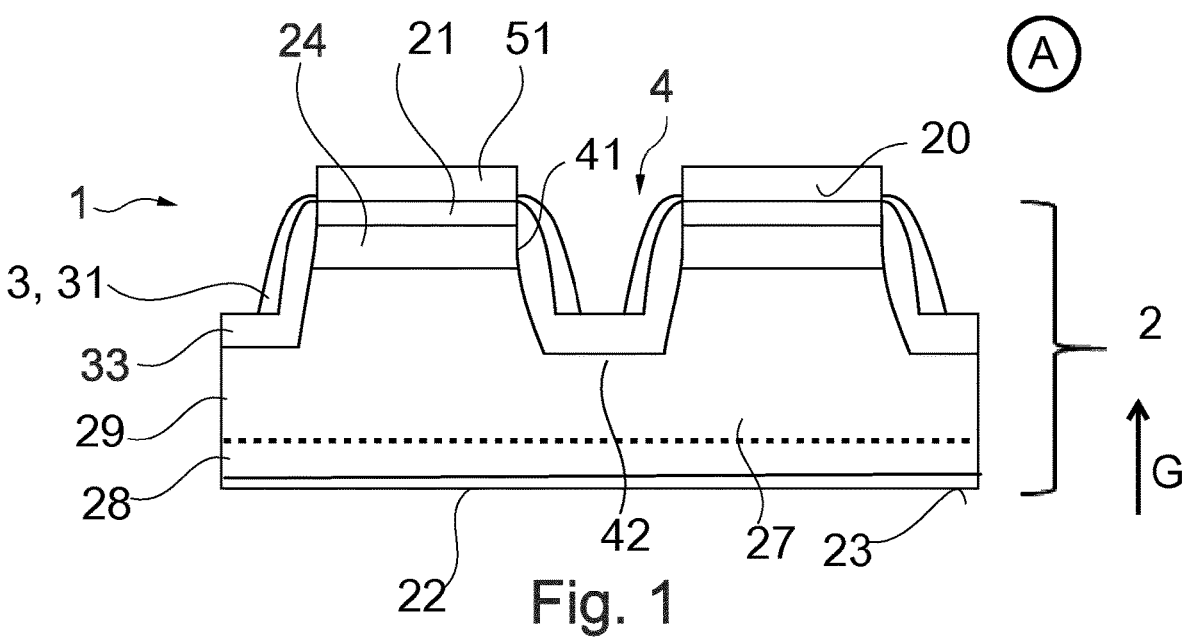

(L) of the trench (4), the top side (21) is formed only by the source regions (21).

14 Claims, 7 Drawing Sheets

(51) Int. Cl.
    *H10D 62/13*          (2025.01)
    *H10D 62/17*          (2025.01)
    *H10D 64/27*          (2025.01)

(52) U.S. Cl.
    CPC ......... *H10D 62/158* (2025.01); *H10D 62/393*
          (2025.01); *H10D 64/513* (2025.01)

(58) Field of Classification Search
    CPC ............. H10D 84/017; H10D 30/0221; H10D
          30/603; H10D 30/6717; H10D 30/668;
          H10D 30/658; H10D 64/025–027; H10D
          30/0275; H10D 30/6894; H10D 30/699;
          H10D 64/513; H10D 64/512; H10D
          30/6211; H10D 84/0158; H10D 84/0193;
          H10D 86/011; H10D 84/834; H10D
          84/853; H10D 86/215; H10B 12/36;
          H10B 12/056
    See application file for complete search history.

(56) References Cited

U.S. PATENT DOCUMENTS

| | | | | |
|---|---|---|---|---|
| 7,696,599 | B2 * | 4/2010 | Hueting ............... | H10D 30/668 |
| | | | | 438/270 |
| 8,021,947 | B2 * | 9/2011 | Grivna ............... | H10D 30/0293 |
| | | | | 438/270 |
| 8,178,922 | B2 * | 5/2012 | Hsieh .................. | H10D 62/393 |
| | | | | 257/302 |
| 9,450,076 | B2 * | 9/2016 | Cascino ............. | H10D 62/158 |
| 11,670,693 | B2 * | 6/2023 | Soma ................... | H10D 64/252 |
| | | | | 257/330 |
| 2005/0258479 | A1 * | 11/2005 | Ono ..................... | H10D 30/668 |
| | | | | 257/E29.066 |
| 2005/0263852 | A1 * | 12/2005 | Ogura ................. | H10D 62/393 |
| | | | | 257/E29.066 |
| 2008/0035992 | A1 * | 2/2008 | Kawaguchi .......... | H10D 30/635 |
| | | | | 257/E29.066 |
| 2011/0136309 | A1 * | 6/2011 | Grivna .............. | H10D 30/0293 |
| | | | | 438/270 |
| 2012/0199901 | A1 * | 8/2012 | Nagata .............. | H10D 30/297 |
| | | | | 257/330 |
| 2012/0286355 | A1 * | 11/2012 | Mauder ............... | H10D 12/481 |
| | | | | 257/330 |
| 2014/0363939 | A1 * | 12/2014 | Nagata ................ | H10D 62/155 |
| | | | | 438/270 |
| 2015/0206968 | A1 * | 7/2015 | Cascino ............ | H10D 30/0293 |
| | | | | 438/294 |
| 2015/0349112 | A1 * | 12/2015 | Grebs ................. | H10D 62/154 |
| | | | | 257/330 |
| 2017/0200799 | A1 * | 7/2017 | Amali ................. | H10D 30/668 |
| 2017/0229552 | A1 * | 8/2017 | Fujita .................... | H10D 30/60 |
| 2018/0076201 | A1 * | 3/2018 | Toyoda ................ | H01L 21/761 |
| 2022/0077315 | A1 * | 3/2022 | Lu ...................... | H10D 30/6211 |
| 2023/0052056 | A1 * | 2/2023 | Lu ..................... | H01L 21/76897 |
| 2023/0197716 | A1 * | 6/2023 | Bomberger .......... | H10D 84/834 |
| | | | | 257/288 |
| 2024/0047569 | A1 * | 2/2024 | Chen ................. | H10D 62/8325 |
| 2024/0355885 | A1 * | 10/2024 | Tawara ............... | H10D 30/021 |

* cited by examiner

POWER FIELD-EFFECT TRANSISTOR AND MANUFACTURING METHOD

CROSS-REFERENCE TO RELATED APPLICATIONS

This application is US National Stage of International Patent Application PCT/EP2020/080983, filed Nov. 4, 2020, the contents of which are incorporated herein by reference.

A power field-effect transistor is provided. A manufacturing method for such a field-effect transistor is also provided.

Documents US 2005/0258479 A1, U.S. Pat. Nos. 7,696, 599 B2 and 6,710,403 B2 refer to trench MOSFETs.

A problem to be solved is to provide a power field-effect transistor that can be operated with high current densities.

This object is achieved, inter alia, by a power field-effect transistor and by a manufacturing method as defined in the independent patent claims. Exemplary further developments constitute the subject matter of the dependent patent claims.

For example, the power field-effect transistor uses source regions at a top side of a semiconductor body near at least one trench that accommodates a gate electrode. Optionally, a double gate structure and/or a plurality of trenches are used to achieve high current densities.

In at least one embodiment, the power field-effect transistor comprises at least two source regions at a top side of a semiconductor body, at least one drain region at a back side of the semiconductor body, and at least two charge barrier regions in the semiconductor body so that electrically between each one of the source regions and the at least one drain region there is one of the charge barrier regions. Moreover, the power field-effect transistor includes at least one gate electrode that is at least partially located in at least one trench in the semiconductor body, and the at least two charge barrier regions are located adjacent to the at least one trench. Next to the at least one trench and seen in a first plane perpendicular with the top side and perpendicular with a main elongation direction of the at least one trench, the top side of the semiconductor body is formed by the at least two source regions, for example, only by the at least two source regions.

For example, the power field-effect transistor is a self-aligned, multi-gated trench SiC power MOSFET that provides high on-state currents while suppressing short channel effects.

By way of example, the power field-effect transistor could comprise a semiconductor body comprising channel regions with multiple crystallographic planes. The channels region may also be identified as the charge barrier regions. If there is a plurality of trenches with trench walls, each of the trenches can extend through the channel regions, wherein a width of the trenches and a distance between the trenches are such that electrons in the channel regions move along the trench walls in a crystallographic plane, in which the electron mobility is higher compared to the other crystallographic planes of the channel regions. The crystallographic plane with the enhanced electron mobility may be located, for example, on a surface of the semiconductor body, maybe at trench walls. A crystallographic plane indicates a plane in a crystallographic lattice of, for example, an epitaxial layer, within which a crystallographic lattice structure is repeated with a periodicity.

The power field-effect transistor may be a multi-gate MOSFET which incorporates more than one gate into a single device. In other words, 'multi-gate' may mean that a multitude of gate electrodes are provided in the device. The multiple gate electrodes may be controlled by a single common gate contact, so that the multiple gate electrodes can operate electrically as a single gate, or by independent gate contacts.

It is, inter alia, an aspect of the power field-effect transistor described herein to provide very narrow structures of trenches and wires, wherein the wires are, for example, the structures between the trenches formed by epitaxial layers. In other words, trench width, as well as thickness and width of the structures between the trenches are dimensioned as small as possible to achieve volume inversion within the wires. Thereby, higher on-state current due to enhanced gate electrostatic control and due to higher cell density is allowed. Furthermore, the higher on-state current is provided due to lower channel doping and higher inversion layer carrier mobility.

In other words, the very narrow structures of the power field-effect transistor described herein can provide volume inversion processes. Thereby, an improved or uniform electron velocity and mobility distribution throughout the channel region can be obtained resulting in better off-state leakage control and suppression of short channel effects.

Short channel effects are suppressed, for example, due to enhanced gate electrostatic control in forward direction. In other words, the power field-effect transistor provides a scaling the whole MOS cell, that means, scaling in all dimensions, including trench density, trench width and channel lengths. This allows to increase the current density significantly and, thus, to improve the static performance. By shrinking all mentioned dimensions of the power field-effect transistor, it has been shown that parasitic capacitances, such as the gate-drain capacitance (CGD), are not increased, since the area of the parasitic capacitor remains constant. Furthermore, channel doping can be significantly reduced due to the proposed design.

The power field-effect transistor can be a npn transistor as well as a pnp transistor. Moreover, in the following the term 'source' refers to the regions at the top side next to the gate electrode while the term 'drain' refers to the at least one region at the back side and opposite the gate electrode. However, to enhance understanding, here consistently the first variant is described, that is, source regions at the top side and drain region at the back side, while all the respective features are also equally disclosed for the second variant, that is, drain regions at the top side and at least one source region at the back side.

That the at least two charge barrier regions, also referred to as channel regions, are electrically between each one of the source regions and the at least one drain region may mean that a current flows from the respective source region to the drain region through the assigned charge barrier region. It is possible that the charge barrier regions are also geometrically located between each one of the source regions and the at least one drain region.

The at least one gate electrode may completely be located in at least one trench. If there is a plurality of trenches and gate electrodes, this may apply to each pair of trench and assigned gate electrode.

That the at least two charge barrier regions are located adjacent to the at least one trench can mean that the respective charge barrier regions touch trench walls of the at least one trench. The trench walls may be oriented in parallel with a growth direction of the semiconductor body or approximately in parallel therewith. 'Approximately' may refer to a tolerance of at most 30° or of at most 20° or of at most 10°; the same tolerances may be applied to the terms 'parallel' or 'perpendicular'.

The main elongation direction of the at least one trench may refer to the direction along which the trench has the largest extent, seen in top view of the top side. For example, the at least one trench is of rectangular shape, seen in top view. Because a length of the at least one trench may exceed a width of the at least one trench considerably, for example, by at least a factor of 10 or by at least a factor of 100 or by at least a factor of 500, the at least one trench may be approximated as a straight line, seen in top view.

An occupied area, next to the at least one trench and seen in the first plane, in which the top side of the semiconductor body is entirely formed by the source regions, may refer to a strip directly adjacent to the trench in which an electric field due to the at least one gate electrode has a dominating influence on charge carrier movement in the semiconductor body. Alternatively or additionally, said occupied area has a width of at least 30% or of at least 60% of a width of the at least one trench and/or of at least 0.3 μm or of at least 0.6 μm. The width of the trench may be an extent of the trench at the top side of the semiconductor body between two source regions assigned to the respective trench.

The gate electrode is applied in the semiconductor body. Between the gate electrode and the semiconductor body, there is an electrically insulating material like a gate oxide. By means of electrically addressing the gate electrode, a flow of current between the source regions and the drain region can be controlled in the intended use of the power field-effect transistor. That is, depending on the voltage on the at least one gate electrode, the charge barrier regions correspondingly allow the flow of current.

According to at least one embodiment, the source regions and the at least one drain region are of a first conductivity type. The charge barrier regions is of a second, opposite conductivity type. For example, the first conductivity type is n and the second conductivity type is p, or vice versa.

In the following, primarily the first-mentioned case, that is, the first conductivity type is n and the second conductivity type p, is discussed, but the presented information applies in the same manner for the second-mentioned case, that is, the first conductivity type is p and the second conductivity type n.

The power field-effect transistor described herein is, for example, a device or is comprised in a device selected from the group comprising or consisting of a metal-oxide-semiconductor field-effect transistor (MOSFET), a metal-insulator-semiconductor field-effect transistor (MISFET), an insulated-gate bipolar transistor (IGBT), and a junction gate field-effect transistor (JFET).

According to at least one embodiment, the semiconductor body is of a silicon-based semiconductor material, like SiC or Si, or the semiconductor body is of a wide bandgap material or a compound-semiconductor material, for example, of a III-V compound-semiconductor material like GaN, or a III-VI compound-semiconductor material like $Ga_2O_3$.

The semiconductor body could partially or completely be a substrate doped by, for example, implantation of ions or by thermal treatment. Moreover, the semiconductor body could partially or also completely be an epitaxially grown section or layer sequence, doped during growth or doped afterwards by, for example, implantation of ions or by thermal treatment. The semiconductor body may be of only one semiconductor material, but a semiconductor body comprising a plurality of semiconductor materials is also possible.

According to at least one embodiment, the power field-effect transistor is a power device or is included in such a device. For example, the power field-effect transistor is configured for a maximum current through the charge barrier regions, that is, the channel regions, of at least 10 A or of at least 50 A. As an option, the maximum current is at most 500 A. Alternatively or additionally, the power field-effect transistor is configured for a maximum voltage of at least kV or of at least 1.2 kV. As an option, the maximum voltage may be at most 6.5 kV.

According to at least one embodiment, seen in the first plane, the at least one gate electrode comprises two wall regions each located at a trench wall of the at least one trench. For example, towards the top side the wall regions become thinner. A thickness of the wall regions is, for example, at least 50 nm or at least 100 nm and/or is at most 0.5 μm or at most 0.2 μm.

For example, the wall regions are of poly-Si or are of at least one metal like TiN, Ti, TaN, W.

According to at least one embodiment, a bottom of the trench is partially free of the at least one gate electrode. The bottom faces the back side. For example, seen in the first plane, the proportion of the bottom that is free of the gate electrode and is free of the wall regions is at least 10% or at least 20% and/or at most 80% or at most 50% of a width of the trench and, thus, of a width of the bottom.

According to at least one embodiment, seen in the first plane, a ratio of the width of the at least one trench to a depth of the at least one trench is at least 0.6 or at least 0.8 and/or is at most 1.4 or at most 1.8. Hence, seen in the first plane the trench may be approximately of square shape.

According to at least one embodiment, seen in the first plane, the width of the at least one trench is at least 0.4 μm or at least 0.6 μm. Alternatively or additionally, said width is at most 3 μm or at most 1.5 μm.

According to at least one embodiment, seen in the first plane, a width of the at least two source regions is at least 0.1 μm or at least 0.2 μm or at least 0.4 μm. Alternatively or additionally, said width is at most 0.8 μm or at most 1.5 μm or at most 3 μm.

According to at least one embodiment, seen in the first plane, a ratio of the width of the at least one trench to the width of the at least two source regions is at most 5 or is at most 3. Alternatively or additionally, said ratio is at least 0.5 or at least 0.8.

According to at least one embodiment, seen in the first plane and along a growth direction of the semiconductor body, a thickness of the at least two charge barrier regions is at least 0.1 μm or at least 0.2 μm. Alternatively or additionally, said thickness is at most 0.7 μm or at most 0.4 μm.

According to at least one embodiment, the wall regions of the gate electrode are electrically connected with each other so that the wall regions are configured to be at the same electric potential. In other words, there is only one gate voltage to be applied to the power field-effect transistor.

According to at least one embodiment, the wall regions and/or all the gate electrodes are electrically connected with each other only outside the at least one trench. Thus, within the at least one trench the wall regions may not be connected. Hence, an electrical connection for the gate electrodes and/or the wall regions may be applied atop the semiconductor body at the top side.

According to at least one embodiment, the power field-effect transistor further comprises at least two doped contact regions. For example, the at least two doped contact regions are each in direct contact with one of the at least two charge barrier regions. The at least two doped contact regions can be of the same conductivity type as the at least two charge barrier regions. The at least two doped contact regions can efficiently be electrically contacted by means of the at least two charge barrier regions.

According to at least one embodiment, next to the at least one trench and seen in a second plane in parallel with the first plane, the top side of the semiconductor body is formed only by the at least two doped contact regions. A width of said area exclusively formed by the at least two doped contact regions may correspond to a width of the occupied area formed by the at least two source regions.

According to at least one embodiment, the power field-effect transistor further comprises one or a plurality of source electrodes. The at least one source electrode electrically contacts the at least two source regions, and may thus electrically contact all or some of the source regions.

According to at least one embodiment, the at least two doped contact regions are also electrically contacted by the at least one source electrode. Hence, it is possible that the at least two source regions and the at least two source regions are configured to be at the same electric potential. Thus, the at least two charge barrier regions can be kept on a well-defined electric potential.

According to at least one embodiment, the power field-effect transistor comprises at least eight source regions and at least eight doped contact regions. This may apply to the number of source regions and doped contact regions assigned to a specific trench. If there is a plurality of trenches, there can be more source regions and doped contact regions. For example, there are at least twelve or at least 20 and/or at most 100 or at most 40 source regions and doped contact regions per trench. These source regions and doped contact regions may be located along both sides of the respective trench in parallel with the main elongation direction, seen in top view of the top side.

According to at least one embodiment, seen along the main elongation direction of the at least one trench and seen in top view of the top side, at both sides of the at least one trench there is an alternating order of source regions and of doped contact regions. Therefore, the at least two charge barrier regions can be kept on a well-defined electric potential in an efficient manner.

According to at least one embodiment, seen along the main elongation direction, at the top side a length of the source regions exceeds a length of the doped contact regions by at least a factor of 5 or by at least a factor of 10. Alternatively or additionally, said difference is at most a factor of 300 or at most a factor of 100. The length of the at least one source region may be an extent of the respectively doped area at the top side of the semiconductor body.

According to at least one embodiment, the power field-effect transistor further comprises at least one doped field adaption region in the semiconductor body. For example, the at least one doped field adaption region is adjacent to the at least one trench and is located at a trench bottom, that is, at a side of the at least one trench remote from the top side. The at least one doped field adaption region may touch the bottom of the trench. By means of the at least one doped field adaption region, an electric field at the bottom can be adjusted.

For example, if there is a plurality of the trenches, then there can be a one-to-one assignment between the trenches and the doped field adaption regions. It is possible that the at least one doped field adaption region and the at least one trench run in a congruent manner, seen in top view of the top side.

According to at least one embodiment, the at least one doped field adaption region and the at least two charge barrier regions are of the same conductivity type, but there can be different doping concentrations. For example, each doped field adaption region is assigned to exactly two charge barrier regions, if there is more than one trench.

According to at least one embodiment, seen in a direction in parallel with the top side in in the first plane, the at least one doped field adaption region terminates flush with the at least one gate electrode. Hence, seen in top view, outer edges of the wall regions assigned to the respective trench may be congruent with outer edges of the assigned doped field adaption region.

According to at least one embodiment, seen in the direction in parallel with the top side and in the first plane, the at least one doped field adaption region protrudes from the at least one trench. Hence, the at least one doped field adaption region is broader than the at least one trench. For example, a width of the doped field adaption region is at least 105% or at least 110% and/or at most 150% or at most 130% of the width of the assigned trench.

According to at least one embodiment, the power field-effect transistor comprises at least one drift region in the semiconductor body. The at least one drift region may be of the first conductivity type, but with a lower dopant concentration than the source regions and the at least one drain region. It is possible that there is only exactly one drift region.

According to at least one embodiment, the at least one drift region is located between the at least two charge barrier regions and the at least one drain region assigned to a specific trench so that the respective source regions are separated from the at least one drift region by means of the at least two charge barrier regions assigned to the respective trench. Hence, current may flow from the respective source region into the assigned charge barrier regions and further into the drift region to finally reach the drain region.

According to at least one embodiment, the at least one trench and the at least one gate electrode extend further towards the back side than the at least two charge barrier regions. Hence, the at least one trench may terminate in the at least one drift region.

According to at least one embodiment, the at least one doped field adaption region is embedded in the at least one drift region. For example, the at least one doped field adaption region is separated from the at least one drain region as well as from the at least two charge barrier regions by means of the at least one drift region. Hence, an influence of the at least one doped field adaption region onto the electric field can efficiently be adjusted.

According to at least one embodiment, a doping concentration in the source regions is at least $5 \times 10^{18}$ cm$^{-3}$ or at least $1 \times 10^{19}$ cm$^{-3}$ or at least $2 \times 10^{19}$ cm$^{-3}$. Alternatively or additionally, said doping concentration is at most $2 \times 10^{20}$ cm$^{-3}$ or at most $1 \times 10^{20}$ cm$^{-3}$ or at most $7 \times 10^{19}$ cm$^{-3}$. For example, said doping concentration is between $1 \times 10^{19}$ cm$^{-3}$ and $1 \times 10^{20}$ cm$^{-3}$ inclusive or between $2 \times 10^{19}$ cm$^{-3}$ and $7 \times 10^{19}$ cm$^{-3}$ inclusive. For example, the same may apply for the at least one drain region.

According to at least one embodiment, a doping concentration in the charge barrier regions, that is, in the channel regions, is at least $5 \times 10^{16}$ cm$^{-3}$ or at least $1 \times 10^{17}$ cm$^{-3}$ or at least $2 \times 10^{17}$ cm$^{-3}$. Alternatively or additionally, said doping concentration is at most $2 \times 10^{18}$ cm$^{-3}$ or at most $1 \times 10^{18}$ cm$^{-3}$ or at most $7 \times 10^{17}$ cm$^{-3}$. For example, said doping concentration is between $1 \times 10^{17}$ cm$^{-3}$ and $1 \times 10^{18}$ cm$^{-3}$ inclusive or between $2 \times 10^{17}$ cm$^{-3}$ and $7 \times 10^{17}$ cm$^{-3}$ inclusive.

According to at least one embodiment, a doping concentration in the at least one drift region is at least $2 \times 10^{15}$ cm$^{-3}$ or at least $4\times10^{15}$ cm$^{-3}$ or at least $6\times10^{15}$ cm$^{-3}$. Alternatively or additionally, said doping concentration is at most $5\times10^{16}$ cm$^{-3}$ or at most $1\times10^{16}$ cm$^{-3}$. For example, said doping concentration is between $2\times10^{15}$ cm$^{-3}$ and $5\times10^{16}$ cm$^{-3}$ inclusive or between $4\times10^{15}$ cm$^{-3}$ and $1\times10^{16}$ cm$^{-3}$ inclusive.

According to at least one embodiment, the doping concentration in the at least one doped field adaption region exceeds the doping concentration in the charge barrier regions, that is, in the channel regions, by at least a factor of 1.2 or by at least a factor of 1.5 or by at least a factor of 1.8. Alternatively or additionally, said difference is at most a factor of 10 or at most a factor of 5 or at most a factor of 3.

According to at least one embodiment, the power field-effect transistor comprises a plurality of the trenches. At least each inner trench is next to two of the source regions. 'Inner trench' or 'inner source region' and the like refers to a trench or source region that has an adjacent trench or an source regions along each long side. It is possible that each trench is next to two of the source regions, and consequently has two assigned charge barrier regions.

According to at least one embodiment, there are at least three of the source regions. Each inner source region may be assigned to two trenches and may be in contact with two trenches. Seen in top view, the trenches and the assigned source regions can run in parallel with each other.

According to at least one embodiment, each one of the trenches is assigned to two of the source regions. Hence, each trench can be in direct contact with one source region on each of its two long sides.

According to at least one embodiment, the power field-effect transistor comprises N trenches wherein N is a natural number and N≥2, and comprises N+1 of the source regions.

According to at least one embodiment, seen in the first plane, between adjacent trenches the top side of the semiconductor body is completely formed by N−1 of the source regions. Thus, in the first plane between the trenches there are only source regions on the top side. This allows a particular high current density in the on-state.

According to at least one embodiment, seen in top view of the top side, the trenches run in parallel with each other. The trenches may be shaped in the manner of straight lines.

For example, N≥20 or N≥40 or N≥60. Alternatively or additionally, 400≥N or 250≥N or 150≥N. As an example, 60≤N≤250.

According to at least one embodiment, there is exactly one drain region that forms the most part or the entire back side. 'Most part' may refer to at least 80% or to at least 90% or to at least 95%.

The power field-effect transistor is, for example, for a power module in a vehicle to convert direct current from a battery to alternating current for an electric motor, for example, in hybrid vehicles or plug-in electric vehicles.

A method for manufacturing the power field-effect transistor is additionally provided. By means of the method, a power field-effect transistor is manufactured as indicated in connection with at least one of the above-stated embodiments.

Features of the power field-effect transistor are therefore also disclosed for the method and vice versa.

In at least one embodiment, the method is for manufacturing a power field-effect transistor and comprises the following steps, for example, in the stated order:

provided the semiconductor body comprising the at least two source regions, the at least one drain region and the at least two charge barrier regions, for example, at least in part by epitaxial growth, creating the at least one trench in the semiconductor body, for example, by means of etching like dry etching, producing the at least one gate electrode that is at least partially located in the at least one trench, for example, by means of sputtering and/or plating and/or evaporating and/or vacuum deposition, and electrically connecting the at least two source regions, the at least two charge barrier regions, for example, by means of sputtering and/or plating and/or evaporating and/or vacuum deposition and/or welding and/or soldering. In case of a JFET, additionally the gate electrode is electrically connected to the at least two source regions and the at least two charge barrier regions.

A power field-effect transistor and a method described herein are explained in greater detail below by way of exemplary embodiments with reference to the drawings. Elements which are the same in the individual figures are indicated with the same reference numerals. The relationships between the elements are not shown to scale, however, but rather individual elements may be shown exaggeratedly large to assist in understanding.

Figure 2:
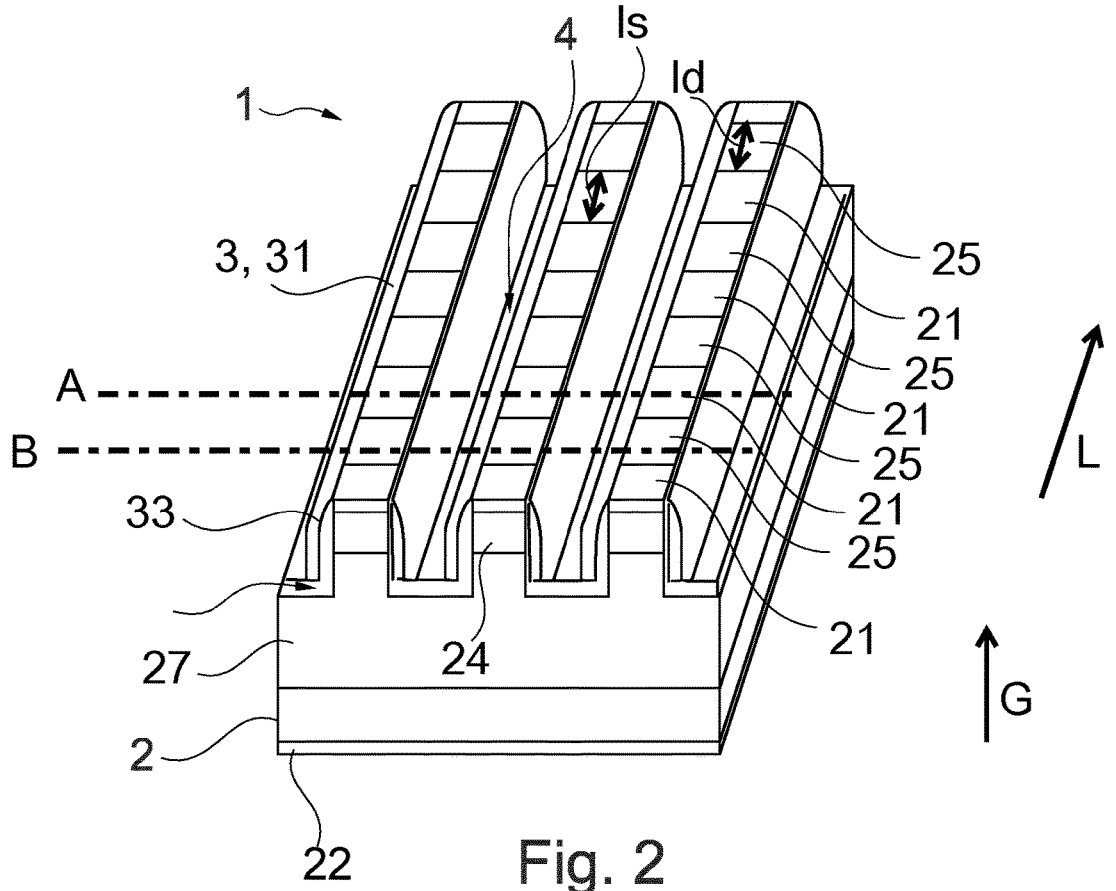
Figure 3:
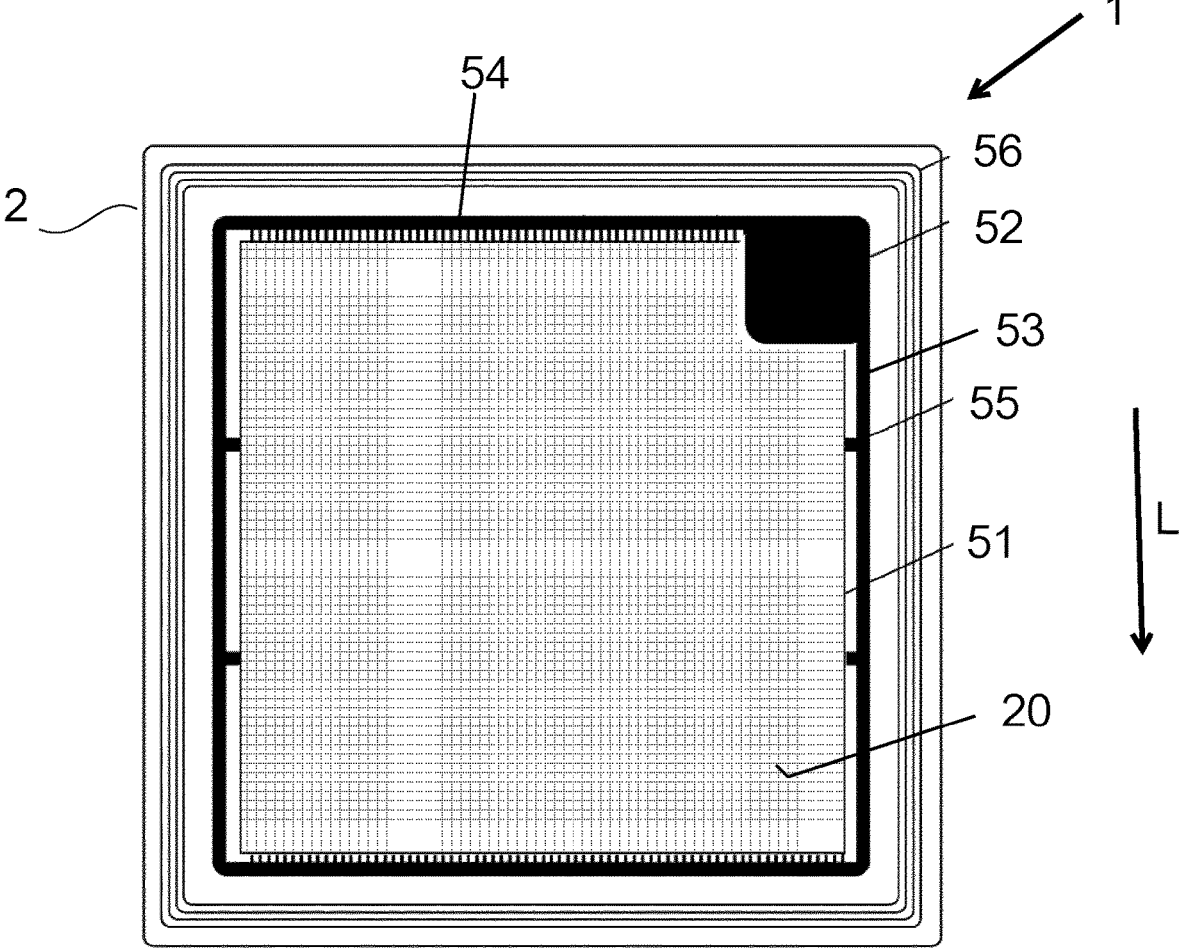
Figure 5:
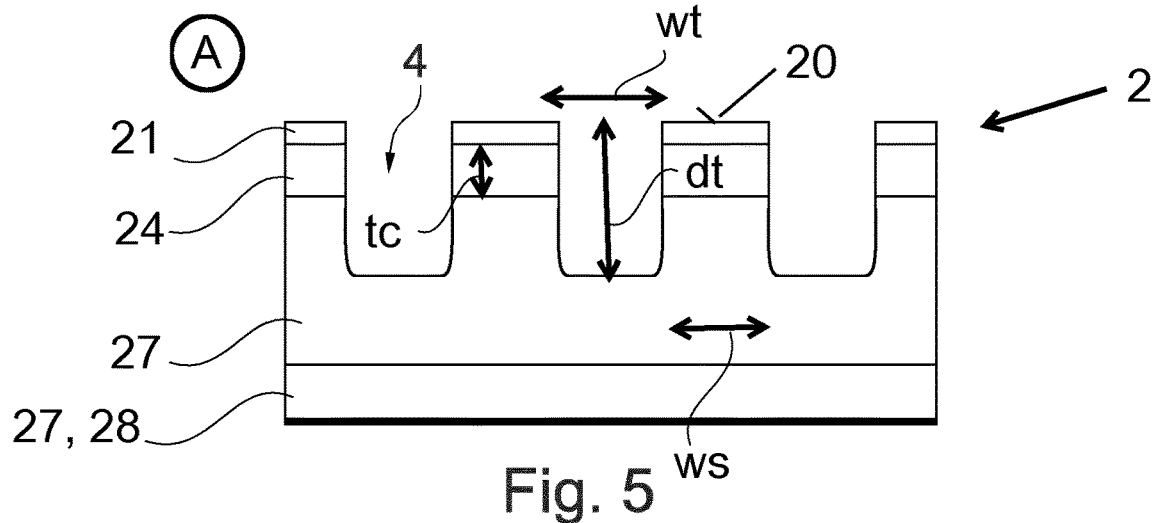
Figure 6:
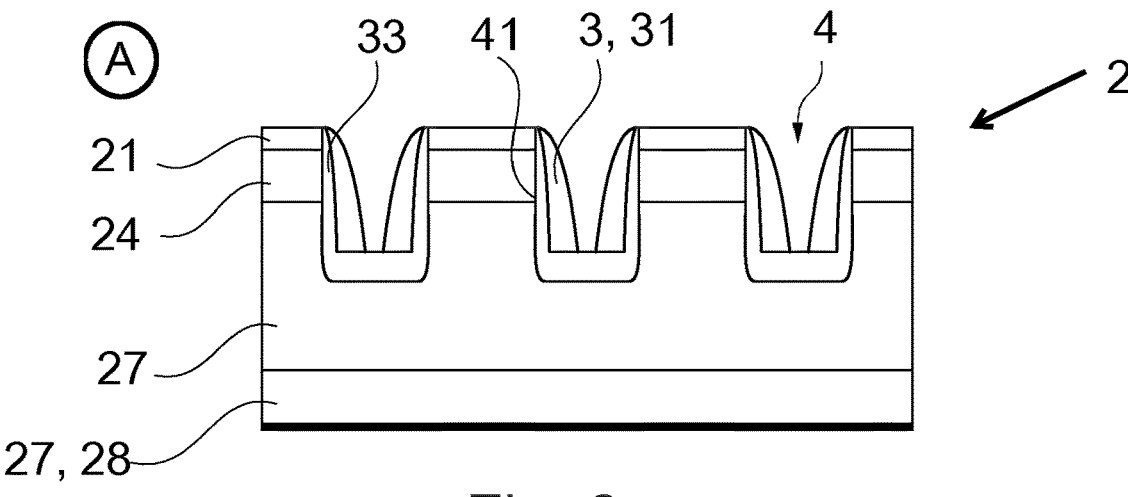
Figures 7, 8, 9:
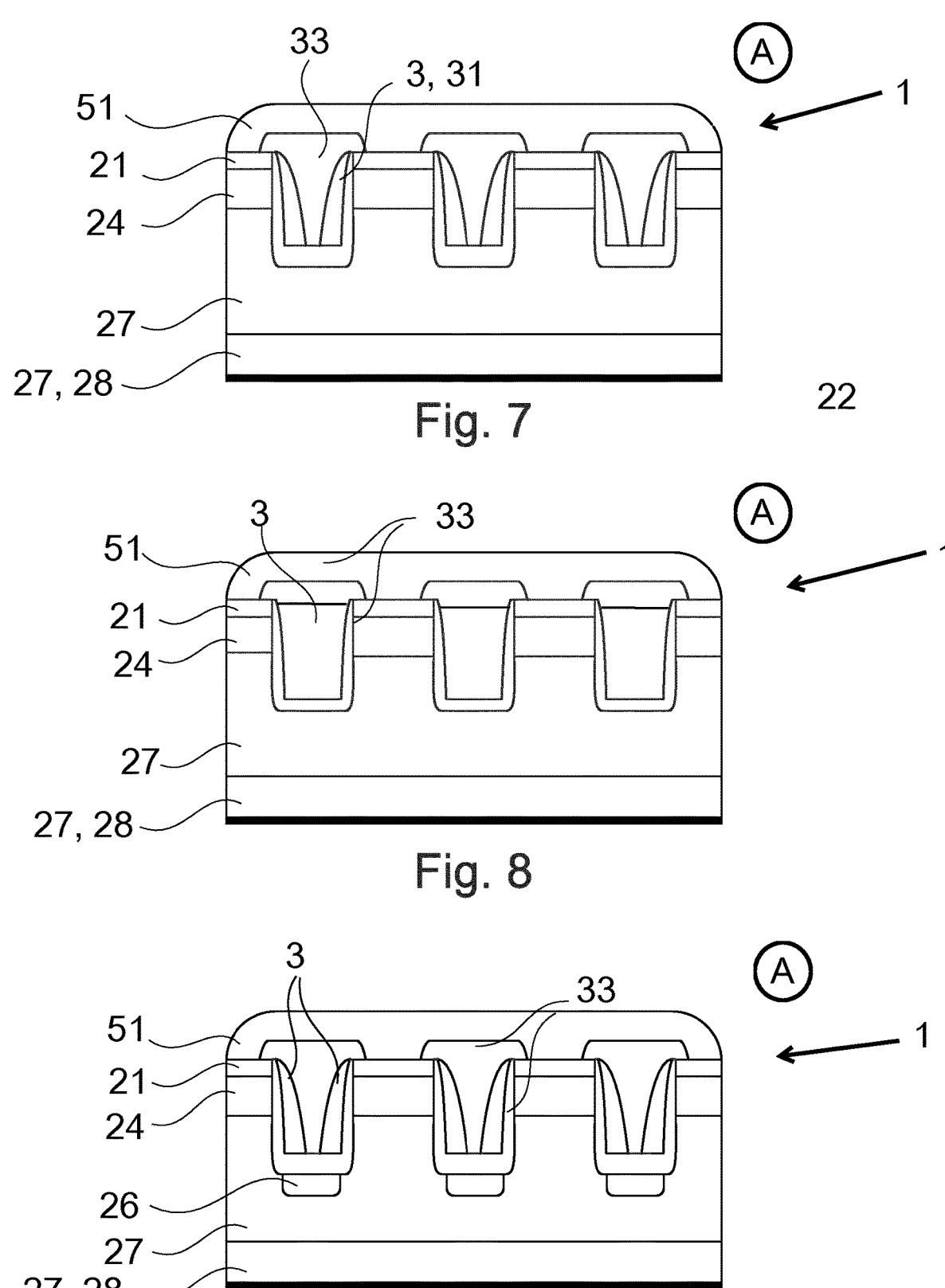
Figure 11:
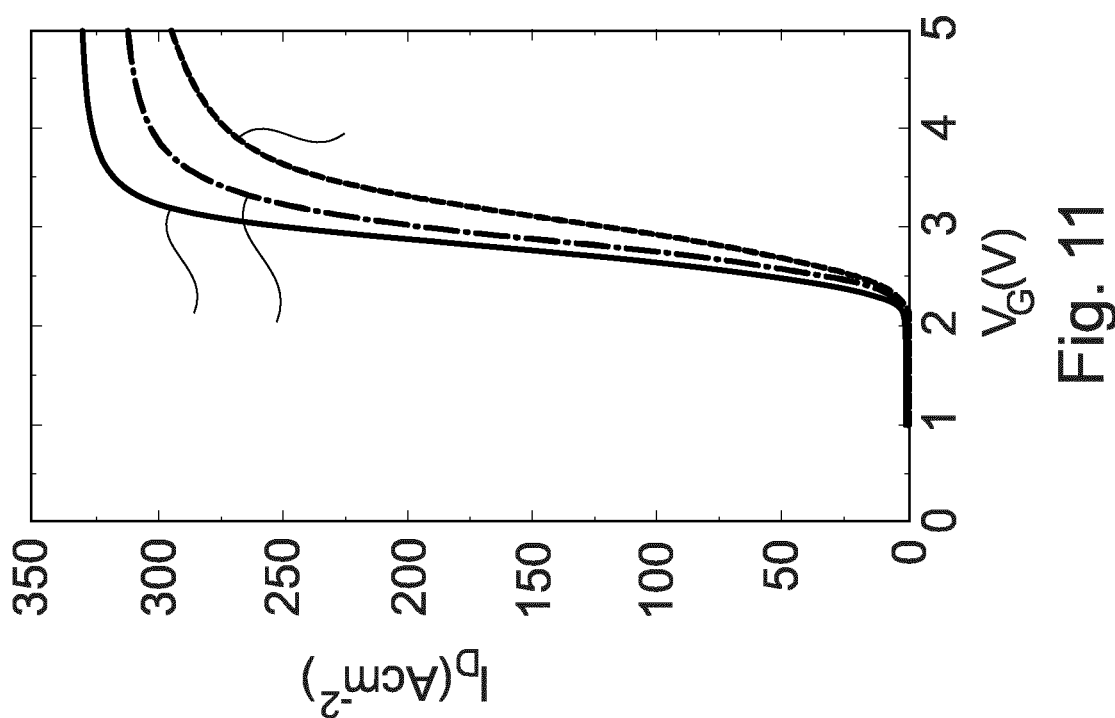
Figure 10:
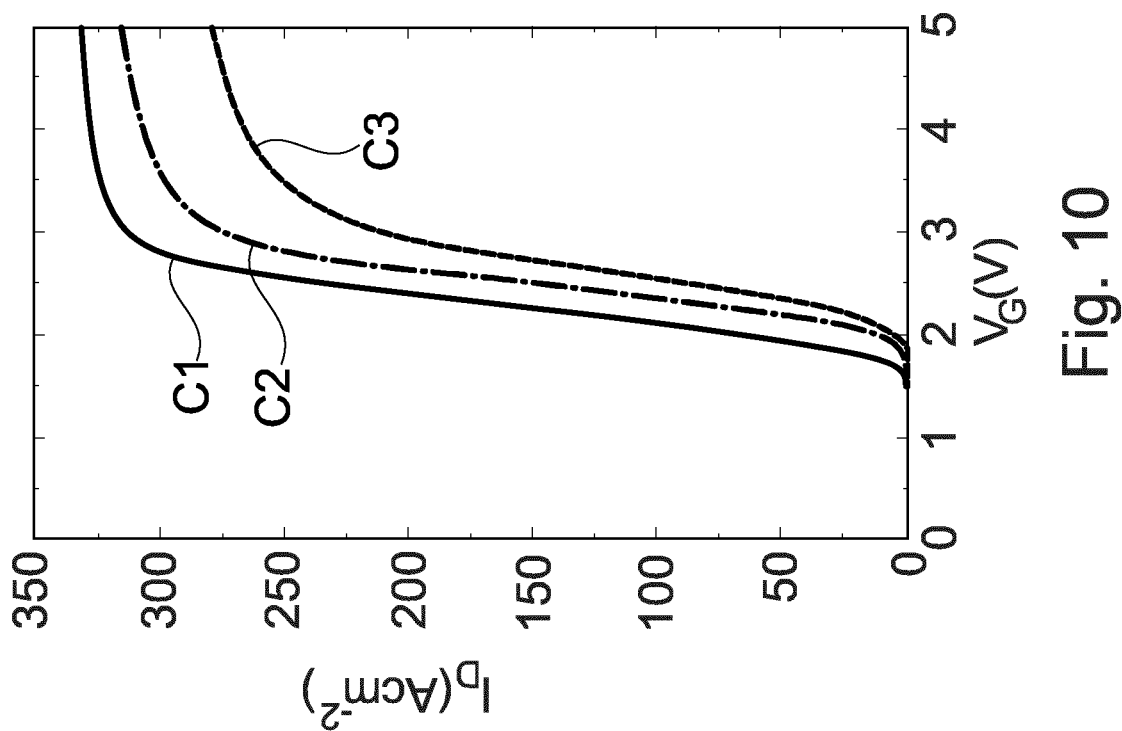
Figure 12:
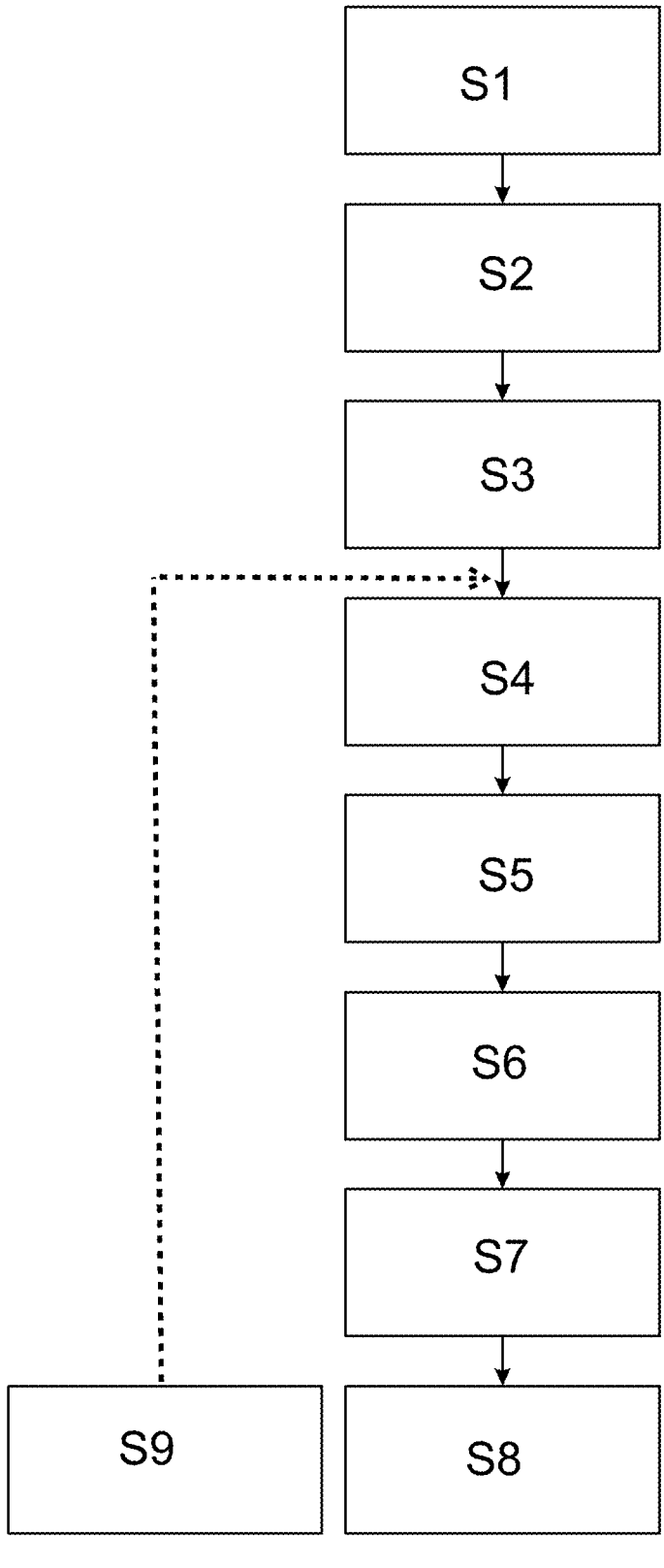
Figure 13:
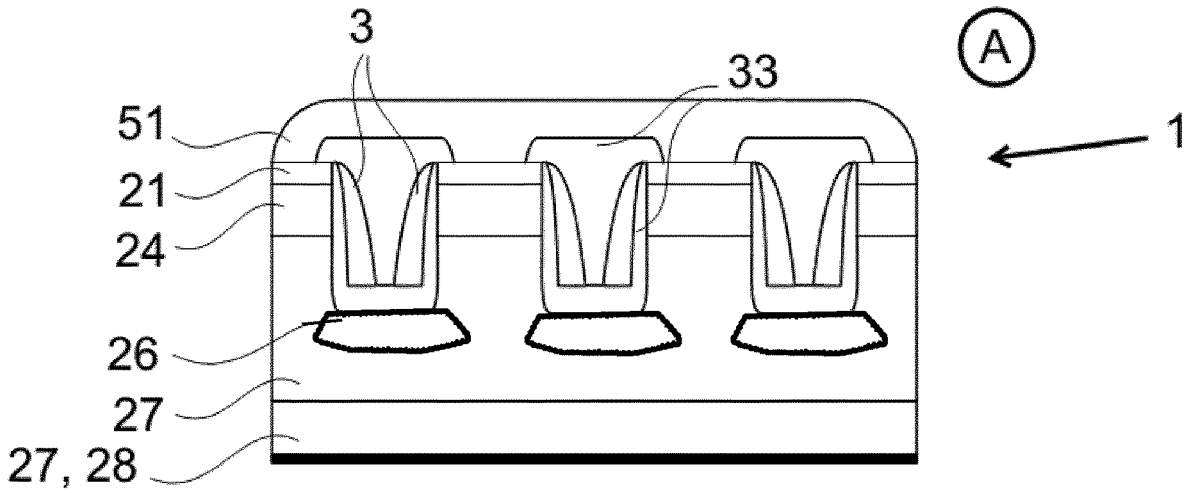

In the figures:

FIG. 1 is a schematic sectional view of an exemplary embodiment of a power field-effect transistor described herein, FIG. 2 is a schematic perspective view of the power field-effect transistor of FIG. 1, FIG. 3 is a schematic top view of the power field-effect transistor of FIG. 1, FIGS. 4 to 7 are schematic sectional views of method steps of an exemplary embodiment of a manufacturing method for power field-effect transistors described herein, FIGS. 8 and 9 are schematic sectional views of exemplary embodiments of power field-effect transistors described herein, FIGS. 10 and 11 are schematic illustrations of an electric performance of exemplary embodiments of power field-effect transistors described herein, FIG. 12 is a schematic block diagram of a of a manufacturing method for power field-effect transistors described herein, and FIG. 13 is a schematic sectional view of an exemplary embodiment of a power field-effect transistor described herein.

FIGS. 1 to 3 show an exemplary embodiment of a power field-effect transistor 1. The power field-effect transistor 1 comprises a semiconductor body 2 having a substrate 28 and an epitaxially grown section 29. Contrary to what is shown in the exemplary embodiments, the semiconductor body 2 may in each case entirely consist either of the substrate 28 or the epitaxially grown section 29, or there can be an epitaxially grown section 29 on each main side of the substrate 28.

In the semiconductor body 2, for example, in the epitaxially grown section 29, there are source regions 21. Moreover, in the semiconductor body 2, for example, in or at the substrate 28, there is a drain region 23 that forms a back side 23 of the semiconductor body 2. Along a growth direction G of the semiconductor body 2, that is, along a growth direction of the epitaxially grown section 29, as an option there is a drift region 27 between the source regions 21 and the drain region 23.

Further, each one of the source regions 21 is on top of one of a plurality of charge barrier regions 24, also referred to as channel regions. Thus, electrically between each one of the source regions 21 and the drain region 23 there is one of the charge barrier regions 24. Hence, current flows from the source regions 21 to the drain region 23 through the charge barrier regions 22.

There is a plurality of trenches 4 having trench walls 41 and a trench bottom 42 in each case, seen in a first plane A in parallel with the growth direction G and perpendicular with a top side of the semiconductor body 2, compare FIG. 1. The trenches 4 have an elongation direction L along a direction of main extent, compare FIG. 2. In FIG. 1, the elongation direction L is perpendicular with the drawing plane and, thus, perpendicular with the first plane A.

The trenches 4 terminate in the drift region 27. Thus, the trenches 4 run completely through the source regions 21 and the charge barrier regions 24 towards the back side 23. For example, the the source regions 21 and the charge barrier regions 24 are plane-parallel layers penetrated by the trenches 4. Seen in the first plane A, for example, the trenches 4 are of rectangular shape wherein the respective rectangle can have rounded corners.

In the trenches 4, there is in each case a gate electrode 3. As an option, the gate electrodes 3 may be split into two wall regions 31 located at the trench walls 41. The trench bottom 42 is in part free of the wall regions 31. That is, the gate electrode 3 is of a double gate structure. The gate electrode 3 is embedded in an insulating material 33 like a gate oxide. For example, a thickness of the insulating material 33 at the trench walls 41 and at the trench bottom 42 is between 50 nm and 0.5 μm inclusive.

As an option, the wall regions 31 may become thinner along the growth direction G, that is, towards the top side 20, see FIGS. 1 and 2. Otherwise, the wall regions 31 can be of constant thickness. For example, seen in the first plane A, the wall regions 31 are arc shaped with top ends at the top side 20 facing away from each other.

Outside an active area of the semiconductor body 2, see FIG. 3, all the wall regions 31 can be connected by means of thin trench contact lines 54 that run in parallel with the trenches 4 and by means of wider gate runners 53.

The gate runners 53 may form a frame around the active area and are connected with a gate contact 52. For example, the gate contact 52 is located in a corner of the top side 20 and covers, for example, at most 10% or at most 5% of the top side 20. As an option, there is at least one transverse contact line 55 running perpendicular with the trenches 4. By means of the transverse contact lines 55, the gate runners 53 and the trench contact lines 54 all the gate electrodes 3 can be on the same electric potential.

On top of the source regions 21, there is a common source electrode 51 for all the source regions 21. To simplify the representation, neither the gate wiring 52, 53, 54, 55 nor the source electrode 51 are shown in FIGS. 1 and 2.

As an option, there are doped contact regions 25 on the top side 20 in a second plane B parallel with the first plane A, see FIG. 2. For example, a length is of the source regions 21 along the elongation direction L is at least ten times and at most 100 times larger than a length ld of the doped contact regions 25.

According to FIG. 2, the doped contact regions 25 and the source regions 21 are arranged in lines perpendicular with the trenches 4. Otherwise, the doped contact regions 25 and the source regions 21 may be arranged in a different manner on the top side 20, for example, in a tessellate or chequered manner. The same applies to all other exemplary embodiments.

By means of the doped contact regions 25, the source regions 21 and the charge barrier regions 24 can be kept on the same electric potential. Hence, the doped contact regions

25 and the source regions 21 can all be electrically connected by means of the source electrode 51 and can be in direct contact with the source electrode 51.

For example, the source regions 21 are $n^{++}$ doped, the optional doped contact regions 25 are $p^+$ doped, the charge barrier regions 24 are p doped, the drift region 27 is $n^-$ doped and the substrate 28 is $n^+$ doped. The drain region 23 may be integrated in the substrate 28 and, for example, may also be $n^{++}$ doped. That is, the doped contact regions 25 may be referred to as $p^+$ plugs.

Thus, for example, a doping concentration in the source regions 21 and in the drain region 23 may be at least $1 \times 10^{19}$ $cm^{-3}$, and/or a doping concentration in the charge barrier regions 24 may be between $1 \times 10^{17}$ $cm^{-3}$ and $1 \times 10^{18}$ $cm^{-3}$ inclusive, and/or a doping concentration in the drift region 27 is between $4 \times 10^{15}$ $cm^{-3}$ and $1 \times 10^{16}$ $cm^{-3}$ inclusive, and/or a doping concentration in the doped contact regions 25 is between $2 \times 10^{18}$ $cm^{-3}$ and $2 \times 10^{19}$ $cm^{-3}$ inclusive, and/or a doping concentration in the substrate 28 is between $1 \times 10^{17}$ $cm^{-3}$ and $2 \times 10^{18}$ $cm^{-3}$ inclusive.

Thus, between adjacent trenches 4, the top side 20 is entirely formed by the source regions 21, seen in the first plane A. Hence, high current densities can be achieved.

Hence, the power field-effect transistor 1 can be a MOS-FET device having a multi-gate trench structure.

For example, a part of the source electrode 51 shown in FIG. 1 is of a silicide. A part of the source electrode 51 shown in FIG. 3 is, for example, of a metal like Al.

The charge barrier regions 24 extend from the source regions 21 to a crystallographic layer below the source region 21. The charge barrier regions 24 may have multiple crystallographic planes (not depicted), of which at least one crystallographic plane has an enhanced electron mobility compared to the other crystallographic planes of the charge barrier regions 24.

A width wt of the trenches 4 between the source regions 21 and the charge barrier regions 24 and a distance ws between the trenches 4 may be such that electrons in the charge barrier regions 24 move along at least one crystallographic plane, in which the electron mobility is higher than in the other crystallographic planes of the charge barrier regions 24.

Accordingly, the width wt of the trenches 4, between the source regions 21 and charge barrier regions 24, may be equal to or smaller than 2 μm, and the distance ws between the trenches 4 may be equal to or smaller than 2 μm, too. Furthermore, the epitaxially grown section 29 with the charge barrier regions 24 can be made of a substance based on Si, which has a hexagonal crystallographic lattice structure and provides in its structure enhanced electron mobility along certain crystallographic planes.

In FIGS. 4 to 7, a manufacturing method for the power field-effect transistor 1 is illustrated, see also the schematic block diagram in FIG. 12.

Figure 4:
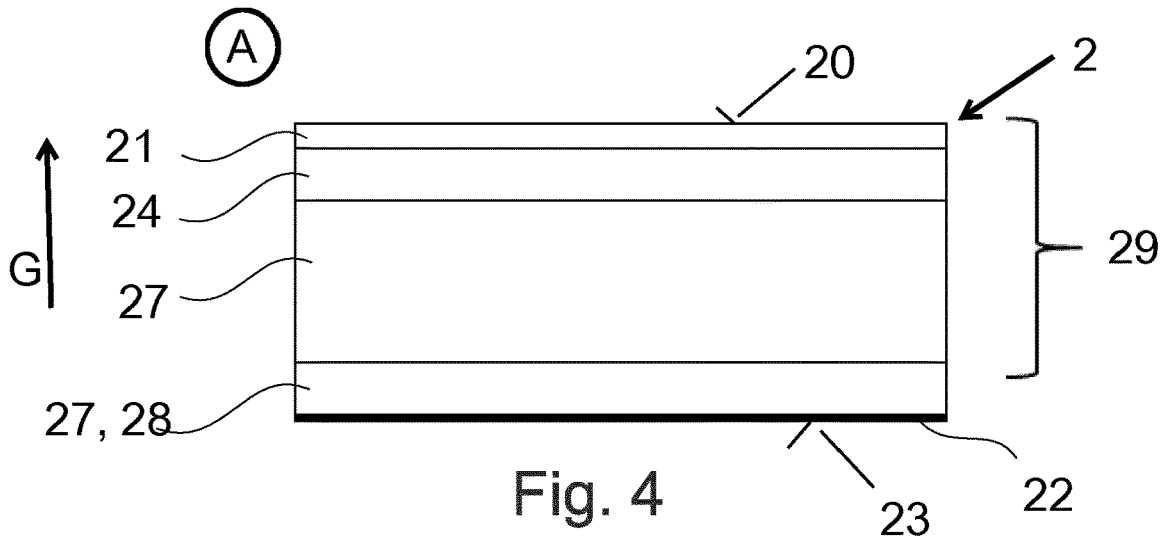

According to FIG. 4, the substrate 28 is provided, step S1. Further, the epitaxially grown section 29 is produced, step S2.

Then, see FIG. 5, the trenches 4 are produced, for example, by means of dry etching, step S3. The trenches 4 extend through the source regions 21 and the charge barrier regions 24. A ratio of the width wt of the trenches 4 to a depth dt of the trenches 4 is 1:1, for example, with a tolerance of at most 40% or of at most 20%.

A ratio of the width wt of the trenches 4 to the width ws of the source regions 21 exceeds, for example, 1 or 1.5 or 2. Accordingly, the width ws of the source regions 21 can be significantly smaller than the width wt of the trenches 4.

A thickness of the charge barrier regions 24 and, thus, a channel length may be between 0.05 μm to 0.5 μm, for example, 0.3 μm.

These values may apply to all other exemplary embodiments, too.

In FIG. 6, the insulating material 33 is applied to provide a passivation in the trenches 4. This may be done in a multi-step manner, so that first the trench bottom 41 is coated, step S4, and afterwards the trench walls 41 are coated, step S5.

Then, see also FIG. 6, the gate electrode 3 and, thus, the wall regions 33 are provided, step S6. Step S6 may include providing a continuous metal layer that is then etched to that only the wall regions 33 remain in the trenches 4. Step S6 may include forming the gate contact 52, the gate runner 53, the trench contact lines 54 and/or the at least one transverse contact line 55. The at least one transverse contact line 55 may extend into and across the trenches 4 to connect all the wall regions 33 in a reliable manner.

According to FIG. 7, a further portion of the insulating material 33 is applied to bury the wall regions 33, step S7.

Then, compare also FIG. 7, the gate electrode 51 that may also contact the optional doped contact regions 25 is applied, step S8.

Otherwise, the same applies for FIGS. 4 to 7 as for FIGS. 1 to 3.

Contrary to what is shown in FIGS. 1 to 7, according to FIG. 8 the gate electrodes 3 are not of a double gate structure, but the gate electrodes 3 are of a one-piece-manner in each of the trenches 4. The same may apply to all other exemplary embodiments.

All the trenches 4 and the assigned doped regions can be of the same fashion throughout the semiconductor body 2. Otherwise, it is possible that there are different kinds of trenches, for example, at edge regions of the semiconductor body 2.

Otherwise, the same applies for FIG. 8 as for FIGS. 1 to 7.

According to FIG. 9, there is a doped field adaption region 26 that may be of p type and that may have a doping concentration between the charge barrier regions 24 and the doped contact regions 25. For example, the doped field adaption region 26 is embedded in the drift region 27 and is in direct contact with the respective trench 4.

As illustrated in FIG. 9, the doped field adaption region 26 may terminate flush with the gate electrode 3 in a lateral direction. Thus, the doped field adaption regions 26 can be narrower than the trenches 4, seen in the first plane A. By means of this arrangement, high current densities and straight current flow can be achieved, and a resistance between the source regions 21 and the drain region 23 can be kept low.

Contrary to that, see FIG. 13 the doped field adaption regions 26 are broader than the respective trenches 4. By means of this arrangement, a more secure current blocking behaviour can be achieved.

The doped field adaption regions 26 may be produced in a step S9 between the steps S3 and S4, compare FIG. 12.

Otherwise, the same applies for FIGS. 9 and 13 as for FIGS. 1 to 8 and 10 to 12.

FIG. 10 schematically shows a performance of a MOSFET device 1 according to the embodiment of FIGS. 1 to 3 with a doping concentration of $5 \times 10^{16}$ cm$^{-3}$ for the charge barrier regions 24. The curve indicated by the reference letter C1 corresponds to a device with a distance ws between the trenches of 0.5 μm. The curve indicated by the reference letter C2 corresponds to a device with a distance ws between the trenches of 1.0 μm. The curve indicated by the reference letter C3 corresponds to a device with a distance ws between the trenches of 2.0 μm. A voltage at the drain region 23 is in each case 2 V, the thickness tc is 300 nm and a thickness of the drift region 27 is 15 μm with a doping level of $4 \times 10^{15}$ cm$^{-3}$.

FIG. 11 schematically shows a performance of a MOSFET device 1 with a doping concentration of $8 \times 10^{16}$ cm$^{-3}$ in the charge barrier region 26. The curve indicated by the reference letter M1 corresponds to a device with a distance between the trenches of 0.5 μm. The curve indicated by the reference letter M2 corresponds to a device with a distance between the trenches of 1.0 μm. The curve indicated by the reference letter G corresponds to a device with a distance between the trenches of 2.0 μm. Otherwise, the same as to FIG. 10 applies, too.

As can be seen from FIGS. 10 and 11, the doping concentration of the charge barrier regions 24 can be reduced to achieve steeper switching behaviour while maintaining high current densities.

The invention described here is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

LIST OF REFERENCE SIGNS

1 power field-effect transistor
2 semiconductor body
20 top side
21 source region
22 drain region
23 back side
24 charge barrier region
25 doped contact region
26 doped field adaption region
27 drift region
28 substrate
29 epitaxially grown section
3 gate electrode
31 wall region
33 insulating material
4 trench
41 trench wall
42 trench bottom
51 source electrode
52 gate contact
53 gate runner
54 trench contact line
55 transverse contact line
56 termination
A first plane
B second plane
C . . . data curve
dt depth of the at least one trench
L elongation direction of the trench
ld length of the doped contact region
ls length of the source region
M . . . data curve
S . . . method step
tc thickness of the at least two charge barrier regions
ws width of the at least two source regions
wt width of the at least one trench

The invention claimed is:

1. A power field-effect transistor comprising:
at least two source regions at a top side of a semiconductor body,
at least one drain region at a back side of the semiconductor body,
at least two charge barrier regions in the semiconductor body so that electrically between each one of the source regions and the at least one drain region there is one of the charge barrier regions, and
at least one gate electrode that is at least partially located in at least one trench in the semiconductor body, and the at least two charge barrier regions are located adjacent to the at least one trench,
wherein, seen in the first plane, the at least one gate electrode comprises two electrically conductive wall regions located at trench walls of the at least one trench,
wherein a trench bottom of the trench is partially free of the at least one gate electrode, and wherein, seen in the first plane, at least one of the following applies:
a ratio of a width of the at least one trench to a depth of the at least one trench is between 0.6 and 1.8 inclusive,
the width of the at least one trench is between 0.4 μm and 3 μm inclusive, a width of the at least two source regions is between 0.2 μm and 1.5 μm inclusive,
a ratio of the width of the at least one trench to the width of the at least two source regions is between 5 and 0.8 inclusive, and
a thickness of the at least two charge barrier regions is between 0.1 μm and 0.7 μm inclusive, and
wherein, next to the at least one trench and seen in a first plane perpendicular with the top side and perpendicular with a main elongation direction of the at least one trench, the top side of the semiconductor body is formed only by the at least two source regions.

2. The power field-effect transistor according to claim 1, wherein the wall regions are electrically connected with each other outside the at least one trench so that all the wall regions are configured to be at the same electric potential.

3. The power field-effect transistor according to claim 1, further comprising at least two doped contact regions each being in direct contact with one of the at least two charge barrier regions and being of the same conductivity type as the at least two charge barrier regions,
wherein, next to the at least one trench and seen in a second plane in parallel with the first plane, the top side of the semiconductor body is formed by the at least two doped contact regions, and
wherein the at least two doped contact regions are electrically contacted by means of the at least two charge barrier regions.

4. The power field-effect transistor according to claim 3, further comprising at least one source electrode,
wherein the at least one source electrode electrically contacts the at least two doped contact regions and the at least two source regions so that the at least two source regions and the at least two charge barrier regions are configured to be at the same electric potential.

5. The power field-effect transistor according to claim 3, comprising at least eight source regions and at least eight doped contact regions, wherein, seen along the main elongation direction of the at least one trench and seen in top view of the top side, at both sides next to the at least one trench there is an alternating order of the source regions and of the doped contact regions.

6. The power field-effect transistor according to claim 5, wherein, seen along the main elongation direction, at the top side a length of the source regions exceeds a length of the doped contact regions by at least a factor of 5 and by at most a factor of 200.

7. The power field-effect transistor according to claim 1, further comprising at least one doped field adaption region in the semiconductor body adjacent to the at least one trench and at a trench bottom,
wherein the at least one doped field adaption region and the at least two charge barrier regions are of the same conductivity type but with different doping concentrations.

8. The power field-effect transistor according to claim 7, wherein, seen in a direction in parallel with the top side, the at least one doped field adaption region terminates flush with the at least one gate electrode, or
wherein, seen in the direction in parallel with the top side, the at least one doped field adaption region protrudes from the at least one trench so that the at least one doped field adaption region is broader than the at least one trench.

9. The power field-effect transistor according to claim 1, further comprising at least one drift region in the semiconductor body,
wherein the at least one drift region is located between the at least two charge barrier regions and the at least one drain region so that the source regions are separated from the at least one drift region by means of the at least two charge barrier regions, and
wherein the at least one trench and the at least one gate electrode extend further towards the back side than the at least two charge barrier regions.

10. The power field-effect transistor according to claim 7, wherein the at least one doped field adaption region is embedded in the at least one drift region and is separated from the at least one drain region and from the at least two charge barrier regions by means of the at least one drift region.

11. The power field-effect transistor according to claim 1, comprising a plurality of the trenches and at least three of the source regions, wherein each one of the trenches is assigned to two of the source regions.

12. The power field-effect transistor according to claim 11, comprising N trenches whereas N is a natural number and N≥2, and comprising N+1 of the source regions, wherein, seen in the first plane, between adjacent trenches the top side is completely formed by N−1 of the source regions.

13. The power field-effect transistor according to claim 11, wherein, seen in top view of the top side, the trenches run in parallel with each other, and wherein there is exactly one drain region that forms the entire back side.

14. A method for manufacturing a power field-effect transistor comprising at least two source region at a top side of a semiconductor body, at least one drain region at a back side of the semiconductor body, at least two charge barrier regions in the semiconductor body so that electrically between each one of the source regions and the at least one drain region there is one of the charge barrier regions, and at least one gate electrode that is at least partially located in at least one trench in the semiconductor body, and the at least two charge barrier regions are located adjacent to the at least one trench, wherein, seen in the first plane, the at least one gate electrode comprises two electrically conductive wall regions located at trench walls of the at least one trench, wherein a trench bottom of the trench is partially free of the at least one gate electrode, and wherein, seen in the first plane, at least one of the following applies: a ratio of a width of the at least one trench to a depth of the at least one trench is between 0.6 and 1.8 inclusive, the width of the at least one trench is between 0.4 µm and 3 µm inclusive, a width of the at least two source regions is between 0.2 µm and 1.5 µm inclusive, a ratio of the width of the at least one trench to the width of the at least two source regions is between 5 and 0.8 inclusive, and a thickness of the at least two charge barrier regions is between 0.1 µm and 0.7 µm inclusive and wherein, next to the at least one trench and seen in a first plane perpendicular with the top side and perpendicular with a main elongation direction of the at least one trench, the top side of the semiconductor body is formed only by the at least two source regions, the method comprising:

providing the semiconductor body comprising the at least two source regions, the at least one drain region and the at least two charge barrier regions, creating the at least one trench in the semiconductor body, producing the at least one gate electrode that is at least partially located in the at least one trench, wherein the at least one gate electrode comprises the two electrically conductive wall regions located at the trench walls of the at least one trench, and electrically connecting the at least two source regions and the at least two charge barrier regions.

* * * * *